(12) United States Patent
Park et al.

(10) Patent No.: US 7,605,067 B2
(45) Date of Patent: Oct. 20, 2009

(54) METHOD OF MANUFACTURING NON-VOLATILE MEMORY DEVICE

(75) Inventors: Ki-Yeon Park, Seoul (KR); Sun-Jung Kim, Suwon-si (KR); Min-Kyung Ryu, Seoul (KR); Seung-Hwan Lee, Suwon-si (KR); Han-Mei Choi, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 206 days.

(21) Appl. No.: 11/859,618

(22) Filed: Sep. 21, 2007

(65) Prior Publication Data

US 2008/0090353 A1 Apr. 17, 2008

(30) Foreign Application Priority Data

Oct. 12, 2006 (KR) .................. 10-2006-0099212

(51) Int. Cl.
*H01L 21/3205* (2006.01)
(52) U.S. Cl. .................. 438/591; 438/216; 438/593; 438/594
(58) Field of Classification Search .......... 438/201, 438/211, 216, 257, 264, 287, 591, 593, 594; 257/E21.68
See application file for complete search history.

(56) References Cited

U.S. PATENT DOCUMENTS 6,803,272 B1 * 10/2004 Halliyal et al. .............. 438/240

FOREIGN PATENT DOCUMENTS

| KR | 1020050045737 | 5/2005 |
|----|---------------|--------|
| KR | 1020050121174 | 12/2005 |
| KR | 1020060024189 | 3/2006 |

OTHER PUBLICATIONS

English Abstract for Publication No. 1020060024189.
English Abstract for Publication No. 1020050121174.
English Abstract for Publication No. 1020050045737.

* cited by examiner

*Primary Examiner*—Thanhha Pham
(74) *Attorney, Agent, or Firm*—F. Chau & Associates, LLC

(57) ABSTRACT

A method of manufacturing a non-volatile memory device includes forming a tunnel insulating layer on a substrate, forming a conductive pattern on the tunnel insulating layer, forming a lower dielectric layer on the conductive pattern, performing a first heat treatment process to density the lower dielectric layer, and forming a middle dielectric layer having an energy band gap smaller than that of the lower dielectric layer on the first heat-treated lower dielectric layer. The method further includes forming an upper dielectric layer including a material substantially identical to that of the lower dielectric layer on the middle dielectric layer, performing a second heat treatment process to densify the middle dielectric layer and the upper dielectric layer and forming a conductive layer on the second heat-treated upper dielectric layer.

12 Claims, 5 Drawing Sheets

METHOD OF MANUFACTURING NON-VOLATILE MEMORY DEVICE

CROSS-REFERENCE TO RELATED APPLICATION

This application claims priority under 35 USC § 119 to Korean Patent Application No. 2006-99212 filed on Oct. 12, 2006, the disclosure of which is hereby incorporated by reference herein in its entirety.

BACKGROUND OF THE INVENTION

1. Technical Field

The present disclosure relates to a method of manufacturing a non-volatile memory device. More particularly, the present disclosure relates to a method of manufacturing a non-volatile memory device including a floating gate electrode.

2. Description of the Related Art

Semiconductor memory devices, in general, are typically classified as either volatile or non-volatile semiconductor memory devices. Volatile semiconductor memory devices such as dynamic random access memory (DRAM) devices and/or static random access memory (SRAM) devices have a relatively high response speed. However, the volatile semiconductor memory devices may lose data stored therein when power is shut off. On the other hand, although non-volatile semiconductor memory devices such as electrically erasable programmable read only memory (EEPROM) devices and/or flash memory devices have a relatively slow response speed, non-volatile semiconductor memory devices are able to maintain data stored therein even when power is shut off.

In EEPROM devices, data may be electrically stored (e.g., programmed) or erased through a Fowler-Nordheim (F-N) tunneling mechanism and/or a channel hot electron injection mechanism. The flash memory device may be classified as either a floating gate type or a charge trap type such as silicon-oxide-nitride-oxide-semiconductor (SONOS) type devices and/or metal-oxide-nitride-oxide-semiconductor (MONOS) type devices.

The float gate type non-volatile memory device may comprise a tunnel insulating layer, a float gate electrode, a blocking layer and a control gate electrode. For example, a multi-layered dielectric layer including a lower silicon oxide layer, a silicon nitride layer and an upper silicon oxide layer may be used as the blocking layer.

Recently, a method of forming the blocking layer out of a high-k material has been developed to increase the capacitance of the blocking layer and to improve the leakage current characteristic. For example, a method of forming the blocking layer out of metal oxide such as, for example, hafnium oxide, zirconium oxide, aluminum oxide, hafnium aluminum oxide, having a dielectric constant higher than that of silicon nitride has been employed.

However, when a hafnium aluminum oxide layer is used as the blocking layer, though the leakage current characteristic may be improved, the reliability of the non-volatile memory device may be deteriorated due to shallow trap sites in the hafnium aluminum oxide layer. In detail, electrons may be trapped in the shallow trap sites in the hafnium aluminum oxide layer from the control gate electrode and/or the float gate electrode, and thus the high temperature stress (HTS) characteristic and threshold voltage window characteristic in the non-volatile memory device may be deteriorated.

Further, a blocking layer including a lower aluminum oxide layer, a middle hafnium oxide layer and an upper aluminum oxide layer typically has a break down voltage less than about 15 MV/cm. Thus, when the blocking layer including the lower aluminum oxide layer, the middle hafnium oxide layer and the upper aluminum oxide layer is employed in a non-volatile memory device, the break down voltage characteristics of the non-volatile memory device may be deteriorated.

SUMMARY OF THE INVENTION

Exemplary embodiments of the present invention provide a method of manufacturing a non-volatile memory device including a blocking layer having improved electrical characteristics.

In accordance with an exemplary embodiment of the present invention, a method of manufacturing a non-volatile memory device is provided. The method includes forming a tunnel insulating layer on a substrate, forming a conductive pattern on the tunnel insulating layer, forming a lower dielectric layer on the conductive pattern, performing a first heat treatment process to densify the lower dielectric layer, and forming a middle dielectric layer having an energy band gap smaller than that of the lower dielectric layer on the first heat-treated lower dielectric layer. The method further includes forming an upper dielectric layer including a material substantially identical to that of the lower dielectric layer on the middle dielectric layer, performing a second heat treatment process to density the middle dielectric layer and the upper dielectric layer and forming a conductive layer on the second heat-treated upper dielectric layer.

In some exemplary embodiments, the first and second heat treatment processes may be performed at a temperature of about 900° C. to about 1250° C. For example, the first and second heat treatment processes may be performed at a temperature of about 1000° C. to about 1200° C.

In some exemplary embodiments, the lower dielectric layer may include a first metal oxide, and the middle dielectric layer may include a second metal oxide having a dielectric constant higher than that of the first metal oxide.

In some exemplary embodiments, the lower dielectric layer may include aluminum oxide and the middle dielectric layer may include hafnium oxide, zirconium oxide or hafnium zirconium oxide.

In some exemplary embodiments, the first and second heat treatment processes may be performed under a gas atmosphere including nitrogen. A partial pressure of oxygen in the gas atmosphere may be no greater than about $1 \times 10^{-4}$ Torr. For example, the partial pressure of oxygen in the gas atmosphere may be in a range of about $1 \times 10^{-6}$ Torr to about $1 \times 10^{-4}$ Torr.

In some exemplary embodiments, a partial pressure of oxygen in the gas atmosphere may be no greater than about $1 \times 10^{-6}$ Torr.

In some exemplary embodiments, a third heat treatment process may be performed to densify the middle dielectric layer after forming the middle dielectric layer.

In some exemplary embodiments, the conductive layer, the upper dielectric layer, the middle dielectric layer, the lower dielectric layer, the conductive pattern and the tunnel insulating layer may be patterned to form a gate structure on the substrate.

In some exemplary embodiments, source/drain regions may be formed at surface portions of the substrate adjacent to the gate structure.

According to the exemplary embodiments of the present invention, the lower, middle and upper dielectric layers may be sufficiently densified by the heat treatment processes.

Thus, the leakage current through the lower, middle and upper dielectric layers may be reduced.

BRIEF DESCRIPTION OF THE DRAWINGS

Exemplary embodiments of the present invention can be understood in more detail from the following description taken in conjunction with the accompanying drawings, wherein.

Figure 1:
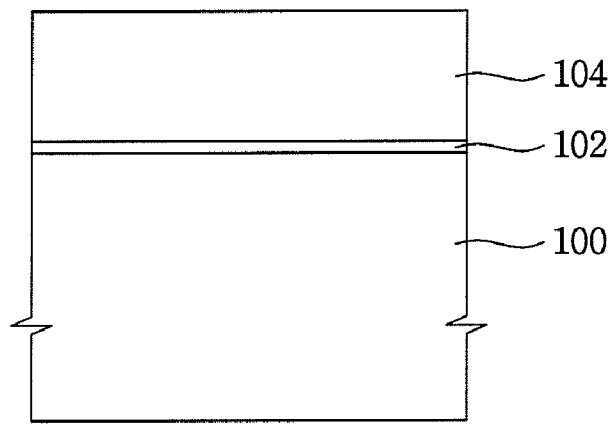
FIGS. 1 to 9 are cross-sectional views illustrating a method of manufacturing a non-volatile memory device in accordance with an exemplary embodiment of the present invention.

DESCRIPTION OF THE EXEMPLARY
EMBODIMENTS OF THE INVENTION

The present invention may, however, be embodied in many different forms and should not be construed as limited to the exemplary embodiments set forth herein. Like reference numerals refer to like elements throughout.

It will be understood that when an element is referred to as being "on" another element, it can be directly on the other element or intervening elements may be present. In contrast when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first thin film could be termed a second thin film, and, similarly, a second thin film could be termed a first thin film without departing from the teachings of the disclosure.

The terminology used herein is for the purpose of describing particular embodiments only and is not intended to be limiting of the invention. As used herein, the singular forms "a," "an" and "the" are intended to include the plural forms as well unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one elements relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

FIGS. 1 to 9 are cross-sectional views illustrating a method of manufacturing a non-volatile memory device in accordance with an exemplary embodiment of the present invention.

Referring to FIG. 1, a pad oxide layer 102 may be formed on a semiconductor substrate 100 such as a silicon wafer, and a mask layer 104 may be then formed on the pad oxide layer 102.

The pad oxide layer 102 may be formed to a thickness of about 70 angstroms (Å) to about 100 Å by a thermal oxidation process or a chemical vapor deposition (CVD) process. Further, the pad oxide layer 102 may be formed at a temperature of about 750° C. to about 900° C. for a surface treatment of the semiconductor substrate 100.

The mask layer may include silicon nitride and may be formed to a thickness of about 1500 Å by, for example, a low pressure chemical vapor deposition (LPCVD) process or a plasma-enhanced chemical vapor deposition (PECVD) process using dichlorosilane ($SiH_2Cl_2$), silane ($SiH_4$), ammonia ($NH_3$), etc.

Figure 2:
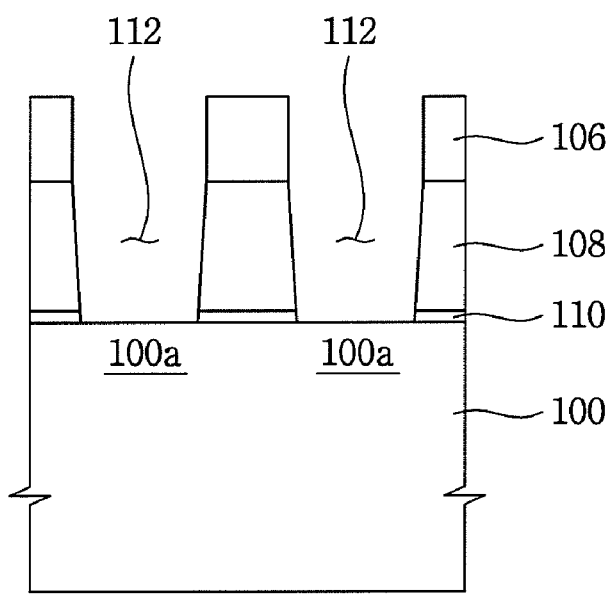

Referring to FIG. 2, photoresist patters 106 partially exposing surface portions of the mask layer 104 may be formed on the mask layer 104 by a photolithography process. The mask layer 104 and the pad oxide layer 102 may be sequentially etched away by an etching process using the photoresist patterns 106 as etching masks, thereby forming mask patterns 108 and pad oxide patterns 110 on the semiconductor substrate 100. Here, the mask patterns 108 and the pad oxide patterns 110 define first openings 112 exposing isolation regions 100a of the semiconductor substrate 100.

For example, the mask layer 104 and the pad oxide layer 102 may be etched away by a dry etching process using plasma or a reactive ion etching process. The photoresist patterns 106 may be removed by, for example, ashing and/or stripping processes after forming the mask patterns 108 and the pad oxide patterns 110.

Figure 3:
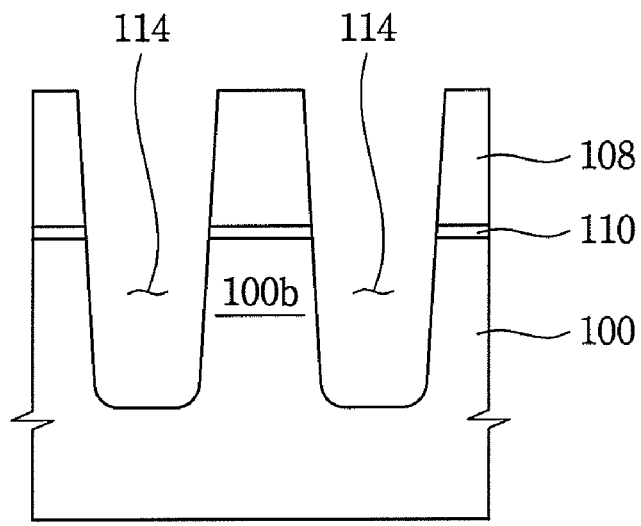

Referring to FIG. 3, an etching process using the mask patterns 108 as etching masks may be performed to etch the isolation regions 100a of the semiconductor substrate 100, thereby forming trenches 114 extending in a first direction across the semiconductor substrate 100. The trenches 114 may be formed to a depth of about 1000 Å to about 5000 Å from the surface of the semiconductor substrate 100.

Alternatively, a thermal oxidation process on sidewalls of the trenches 114 may be additionally performed so as to cure silicon damage caused by impinging high energy ions during the etching process for forming the trenches 114 and to prevent leakage current from being generated through the sidewalls of the trenches 114. Trench oxide layers may be formed to a thickness of about 50 Å to about 250 Å on the inner surfaces of the trenches 114 during the thermal oxidation process.

Further, liner nitride layers may be formed to a thickness of about 50 Å to about 100 Å on the trench oxide layers. Such liner nitride layers may substantially reduce, or prevent altogether, diffusion of impurities such as, for example, carbon and hydrogen from a subsequently formed trench-filling layer. e.g., a field insulating layer into active regions 100b defined by the trenches 114.

According to another exemplary embodiment of the present invention, the trenches 114 may be formed by an etching process using the photoresist patterns 106 as etching masks.

Figure 4:
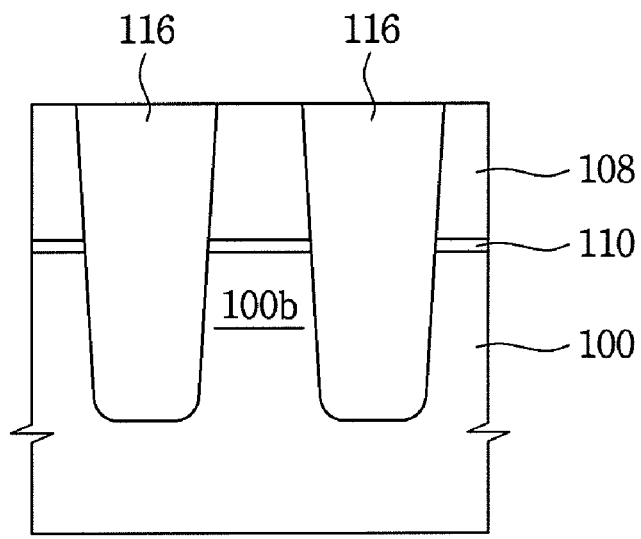

Referring to FIG. 4, a field insulating layer may be formed on the semiconductor substrate 100 in which the trenches 114 are formed so as to sufficiently fill up the trenches 114. Examples of a material that may be used for the field insulating layer may include silicon oxide such as, for example, undoped silicate glass (USG), tetra-ethyl-ortho-silicate (TEOS), high-density plasma chemical vapor deposition (HDP-CVD) oxide, or a combination thereof. For example, the field insulating layer may be formed by an HDP-CVD process using silane ($SiH_4$), oxygen ($O_2$) and argon (Ar) as plasma source gases.

A planarization process such as, for example, a chemical mechanical polishing (CMP) process may be performed to remove an upper portion of the field insulating layer until the mask patterns 108 are exposed, thereby forming field insulating patterns 116 in the trenches 114. The field insulating patterns 116 may serve as isolation layer patterns and define the active regions 100b of the semiconductor substrate 100. The mask patterns 108 may be partially removed during the planarization process.

Figure 5:
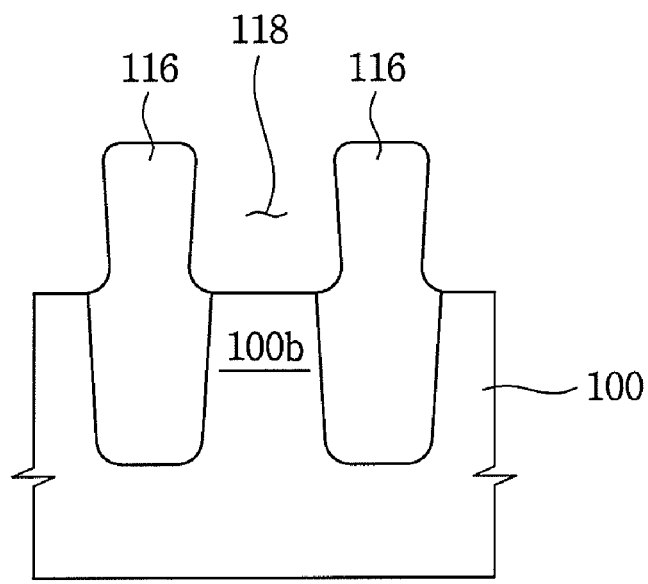

Referring to FIG. 5, the mask patterns 108 and the pad oxide layer patterns 110 may be removed to form second openings 118 exposing the active regions 100b of the semiconductor substrate 100. The mask patterns 108 may be removed, for example, by an etching solution including phosphoric acid, and the pad oxide layer patterns 110 may be removed by a diluted hydrofluoric acid solution. As shown in figures, the field insulating patterns 116 may be partially removed while the mask patterns 108 and the pad oxide layer patterns 110 are removed.

Figure 6:
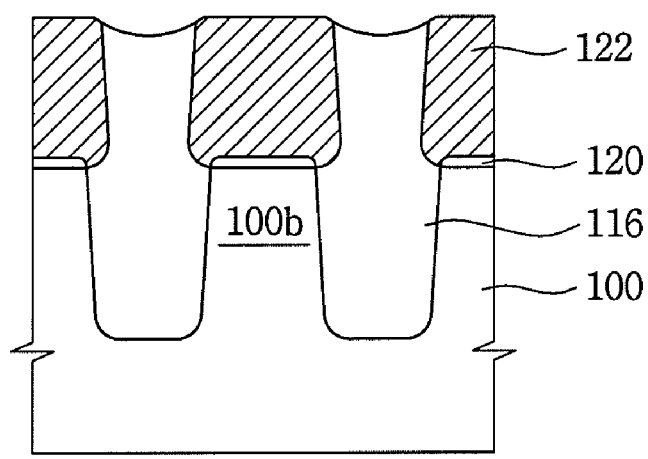

Referring to FIG. 6, a tunnel insulating layer 120 may be formed on the exposed active regions 100b. The tunnel insulating layer 120 may include, for example, silicon oxide formed by a thermal oxidation process. Other examples of a material that may be used for the tunnel insulating layer 120 may include but are not limited to fluorine-doped silicon oxides carbon-doped silicon oxide, a low-k material, or a combination thereof.

For example, the tunnel insulating layer 120 may be formed to a thickness of about 30 Å to about 100 Å on the active regions 100b by a thermal oxidation process.

A first conductive layer may be formed on the tunnel insulating layer 120 and the field insulating patterns 116. The first conductive layer may include impurity-doped polysilicon and may be formed at a temperature of about 580° C. to about 620° C. using silane ($SiH_4$) gas and phosphine ($PH_3$) gas.

After forming the first conductive layer, a planarization process such as, for example, a CMP process or an etch back process may be performed until the field insulating patterns 116 are exposed, thereby forming conductive patterns 122 serving as floating gate patterns in the second openings 118. The field insulating patterns 116 may be partially removed during the planarization process.

Figure 7:
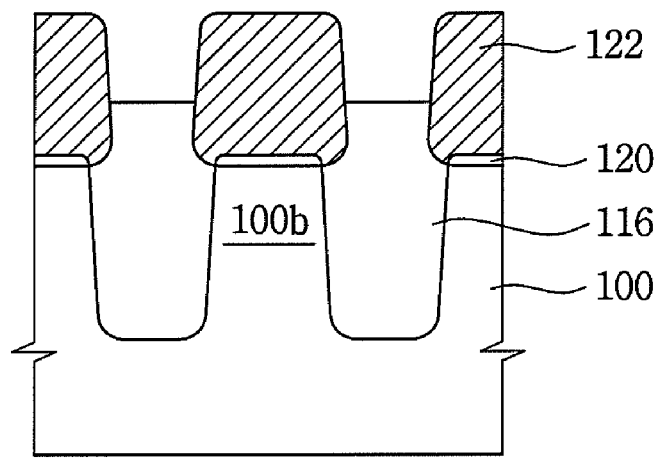

Referring to FIG. 7, upper portions of the field insulating patterns 116 may be removed to thereby expose upper sidewall portions of the conductive patterns 116. The upper portions of the field insulating patterns 116 may be removed by, for example, an anisotropic or isotropic etching process. Here, it is desirable that the etching process is performed not to expose the tunnel insulating layer 120 on the active regions 100b, and thus the tunnel insulating layer 120 may not be damaged by an etching solution or an etching gas used for removing the upper portions of the field insulating patterns 116. Further, while removing the upper portions of the field insulating patterns 116, the conductive patterns 122 may be partiality removed such that corner portions of the conductive patterns 122 may be rounded off.

Figure 8:
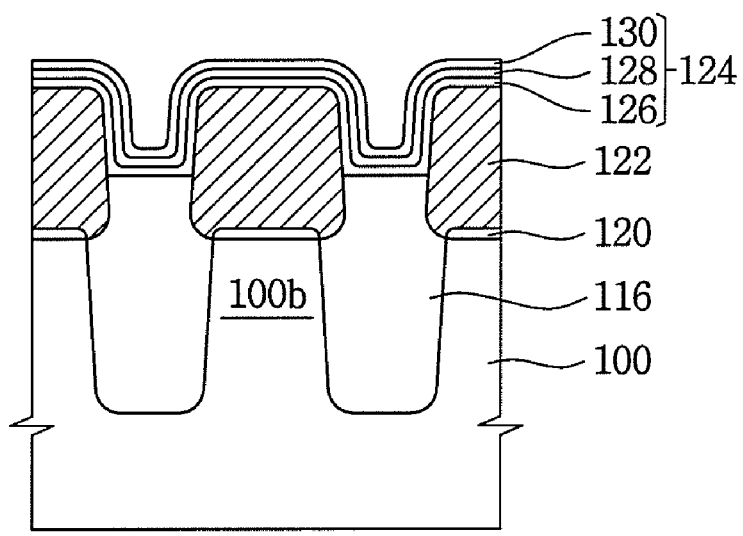

Referring to FIG. 8, a blocking layer 124 may be formed on the conductive patterns 122 and the field insulating patterns 116. The blocking layer 124 may include a lower dielectric layer 126, a middle dielectric layer 128 and an upper dielectric layer 130.

The lower dielectric layer 126 may include a first metal oxide and may be formed to a thickness of about 50 Å to about 200 Å. The middle dielectric layer 128 may include a second metal oxide having an energy band gap smaller than that of the lower dielectric layer 126 and may be formed to a thickness of about 50 Å to about 200 Å on the tower dielectric layer 126. Further the second metal oxide may have a dielectric constant higher than that of the first metal oxide. The upper dielectric layer 130 may include a material substantially identical to that of the lower dielectric layer 126, and may be formed to a thickness of about 50 Å to about 200 Å on the middle dielectric layer 128. For example, the first metal oxide may be aluminum oxide, and the second metal oxide may be hafnium oxide or zirconium oxide. As described above, the lower and upper dielectric layers 126 and 130 may be formed using a material greater than that of the middle dielectric layer 128 to thereby reduce the leakage current through the blocking layer 124.

The first metal oxide may be formed by, for example an atomic layer deposition (ALD) process or a chemical vapor deposition (CVD) process using a source gas including an aluminum precursor and an oxidizing agent. Examples of the aluminum precursor may include but are not limited to trimethyl aluminum (TMA; $Al(CH_3)_3$), triethyl aluminum (TEA; $Al(C_2H_5)_3$), or a combination thereof. Examples of the oxidizing agent may include but are not limited to ozone ($O_3$), oxygen ($O_2$), water vapor ($H_2O$), plasma $O_2$, or a combination thereof.

For example, the lower dielectric layer 126 may be formed to a thickness of about 100 Å on the conductive patterns 122 and field insulating patterns 116 by an ALD process.

After forming the lower dielectric layer 126, a first heat treatment process may be performed to density the lower dielectric layer 126. The first heat treatment process may be performed at a temperature of about 900° C. to about 1250° C. For example, the first heat treatment process may be performed at a temperature of about 1000° C. to about 120° C. For example, a rapid thermal annealing (RTA) process may be performed at a temperature of about 1050° C. for about 3 minutes after forming the lower dielectric layer 126.

Further, the first heat treatment process may be performed, for example, under a gas atmosphere including nitrogen. Here, it is desirable that the gas atmosphere in a chamber for first heat treatment process does not include oxygen to thereby prevent the conductive patterns 122 from being oxidized by penetrating the oxidizing agent. Further, nitrogen atoms may be introduced into the lower dielectric layer 126 during the first heat treatment process, and thus the leakage current through the lower dielectric layer 126 may be reduced. For example, the first heat treatment process may be performed under a gas atmosphere having a partial pressure of oxygen no greater than about $1\times10^{-4}$ Torr. For example, the first heat treatment process may be performed under a gas atmosphere having a partial pressure of oxygen between about $1\times10^{-6}$ Torr and about $1\times10^{-4}$ Torr. In accordance with another exemplary embodiment of the present invention, the first heat treatment process may be performed under a gas atmosphere having a partial pressure of oxygen no greater than about $1\times10^{-6}$ Torr.

The second metal oxide may be formed by, for example an ALD process or a CVD process using a source gas including a hafnium precursor or a zirconium precursor and an oxidizing agent. Examples of the hafnium precursor may include but are not limited to tetrakis dimethyl amino hafnium (TDMAH; $Hf[N(CH_3)_2]_4$) tetrakis ethyl methyl amino hafnium (TEMAH; $Hf[N(C_2H_5)CH_3]_4$), tetrakis diethyl amino hafnium (TDEAH; $Hf[N(C_2H_5)_2]_4$), $Hf[OC(CH_3)_2CH_2OCH_3]_4$, $Hf[OC(CH_3)_3]_4$, or a combination thereof. Examples of the zirconium precursor may include but are not limited to tetrakis ethyl methyl amino zirconium (TEMAZ; $Zr[N(CH_3)(C_2H_5)]_4$), zirconium butyl oxide ($Zr(O-tBu)_4$), or a combination thereof. Examples of the oxidizing agent may include but are not limited to ozone ($O_3$), oxygen ($O_2$), water vapor ($H_2O$), plasma $O_2$, or a combination thereof.

For example, the middle dielectric layer 128 may be formed to a thickness of about 100 Å on the lower dielectric layer 126 by an ALD process.

For example, the upper dielectric layer 130 may include aluminum oxide, and may be formed to a thickness of about 100 Å on the middle dielectric layer 128 by an ALD process.

After forming the upper dielectric layer 130, a second heat treatment process may be performed to densify the middle and upper dielectric layers 128 and 130. The second heat treatment process may be performed at a temperature of about 900° C. to about 1250° C. For example, the second heat treatment process may be performed at a temperature of about 1000° C. to about 1200° C. For example, a rapid thermal annealing (RTA) process may be performed at a temperature of about 1050° C. for about 3 minutes after forming the upper dielectric layer 130.

Further, the second heat treatment process may be performed, for example, under a gas atmosphere including nitrogen. Here, it is desirable that the gas atmosphere in a chamber for first heat treatment process does not include oxygen to thereby prevent the conductive patterns 122 from being oxidized by penetrating the oxidizing agent. Further, nitrogen atoms may be introduced in the upper dielectric layer 130 during the second heat treatment process, and thus the leakage current through the blocking layer 124 may be reduced. For example, the second heat treatment process may be performed under a gas atmosphere having a partial pressure of oxygen no greater than about $1\times10^{-4}$ Torr. For example, the second heat treatment process may be performed under a gas atmosphere having a partial pressure of oxygen of about $1\times10^{-6}$ Torr to about $1\times10^{-4}$ Torr. In accordance with another exemplary embodiment of the present invention, the second heat treatment process may be performed under a gas atmosphere having a partial pressure of oxygen no greater than about $1\times10^{-6}$ Torr.

When the first and second heat treatment processes are performed under a gas atmosphere including oxygen, a dielectric layer having a relatively low dielectric constant, e.g., a silicon oxide layer, may be formed between the blocking layer 124 and the conductive patterns 122 by oxidizing the conductive patterns 122.

As described above, the lower dielectric layer 126 is densified by the first heat treatment process, and the blocking layer 124 including the lower, middle and upper dielectric layers 126, 128 and 130 is sufficiently densified by the second heat treatment process. Thus, the leakage current through the blocking layer 124 may be reduced.

The blocking layer 124 may be crystallized during the first and second heat treatment processes. If grain boundaries of the lower, middle and upper dielectric layers 126, 128 and 130 pass through the blocking layer 124, the leakage current may flow through dangling bonds at the grain boundaries. That is, the grain boundaries may serve as a leakage current path. However, the lower and upper dielectric layers 126 and 130 have a grain size different from that of the middle dielectric layer 128, and thus grain boundaries of the lower, middle and upper dielectric layers 126, 128 and 130 are not connected from each other through the blocking layer 124. Thus, the leakage current through the blocking layer 124 may be sufficiently reduced.

A number of defect sites may be generated in the blocking layer 124, and may serve as charge trap sites. However, the first and second heat treatment processes are performed at a sufficiently high temperature of about 900° C. to about 1250° C. to thereby remove the defect sites, and thus the data reliability and an HTS characteristic of a non-volatile memory device may be improved.

Further, the lower dielectric layer 126 is sufficiently densified by the first heat treatment process after forming the lower dielectric layer 126. Thus, inter-diffusion of metal may be suppressed between the lower and middle dielectric layers 126 and 128.

In accordance with another exemplary embodiment of the present invention, after forming the middle dielectric layer 128, an additional heat treatment process may be performed on the middle dielectric layer 128. The additional heat treatment process may be performed to suppress inter-diffusion of metal between the middle and upper dielectric layers 128 and 130. For example, the additional heat treatment process may be performed under process conditions substantially the same as the first heat treatment process.

Figure 9:
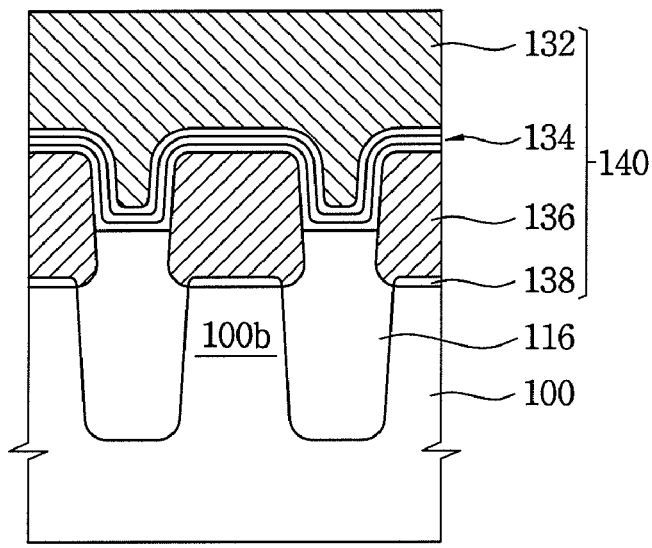

Referring to FIG. 9, after forming the blocking layer 124, a second conductive layer may be formed on the blocking layer 124. Examples of a material for the second conductive layer may include but are not limited to impurity-doped polysilicon, metal, metal silicide, and the like. For example, the second conductive layer may include an impurity-doped polysilicon layer and a metal layer or a metal silicide layer formed on the impurity-doped polysilicon layer. The metal layer may include but is not limited to tungsten, and the metal silicide layer may include but is not limited to tungsten silicide (WSi), titanium silicide (TiSi), cobalt silicide (CoSi) or tantalum silicide (TaSi).

The second conductive layer may be patterned to form a control gate electrode 132 extending in a second direction different from the first direction. Further, the blocking layer 124, the conductive patterns 122 and the tunnel insulating layer 120 may be sequentially patterned to form a gate structure 140 including the control gate electrode 132, a blocking layer pattern 134, floating gate patterns 136 and tunnel insulating patterns 138.

Source/drain regions may be formed at surface portions of the active region 100b adjacent to the gate structure 140 by an impurity doping process and a heat treatment for activating the impurities to thereby constitute a non-volatile memory device.

Leakage Current Characteristic of Non-Volatile Memory Device

Primarily, a first non-volatile memory device was manufactured by a conventional method. For example, a tunnel insulating layer and a conductive pattern were formed on a semiconductor substrate such as a silicon wafer. A blocking layer was formed on the tunnel insulating layer and the conductive pattern, which includes a lower aluminum oxide layer having a thickness of about 55 Å, a middle hafnium oxide layer having a thickness of about 200 Å and an upper aluminum oxide layer having a thickness of about 55 Å. A conductive layer was formed on the blocking layer. A gate structure was formed by patterning the conductive layer, the blocking layer, the conductive pattern and the tunnel insulating layer. Source/drain regions were formed at surface portions of the semiconductor substrate adjacent to the gate structure.

Secondarily, a second non-volatile memory device was manufactured by an exemplary embodiment of the present invention. For example, a tunnel insulating layer and a conductive pattern were formed on a semiconductor substrate such as a silicon wafer. A blocking layer was formed on the tunnel insulating layer and the conductive pattern, which includes a lower aluminum oxide layer, a middle hafnium oxide layer and an upper aluminum oxide layer. For example, after forming the lower aluminum oxide layer to a thickness of about 100 Å, a first heat treatment process was performed at a temperature of about 1050° C. Further, the middle hafnium oxide layer was formed to a thickness of about 100 Å on the primarily heat-treated lower aluminum oxide layer, and the upper aluminum oxide layer was then formed to a thickness of about 100 Å on the middle hafnium oxide layer. A second heat treatment process was performed at a temperature of about 1050° C. on the blocking layer. A conductive layer was formed on the secondarily heat-treated blocking layer. A gate structure was formed by patterning the conductive layer, the heat-treated blocking layer, the conductive pattern and the tunnel insulating layer. Source/drain regions were formed at surface portions of the semiconductor substrate adjacent to the gate structure.

An equivalent oxide thickness (EOT) of the blocking layer in the first non-volatile memory device was measured at about 97.9 Å, and an EOT of the blocking layer in the second non-volatile memory device was measured at about 97.8 Å.

After forming the first and second non-volatile memory devices, leakage currents through the blocking layers were measured.

Figure 10:
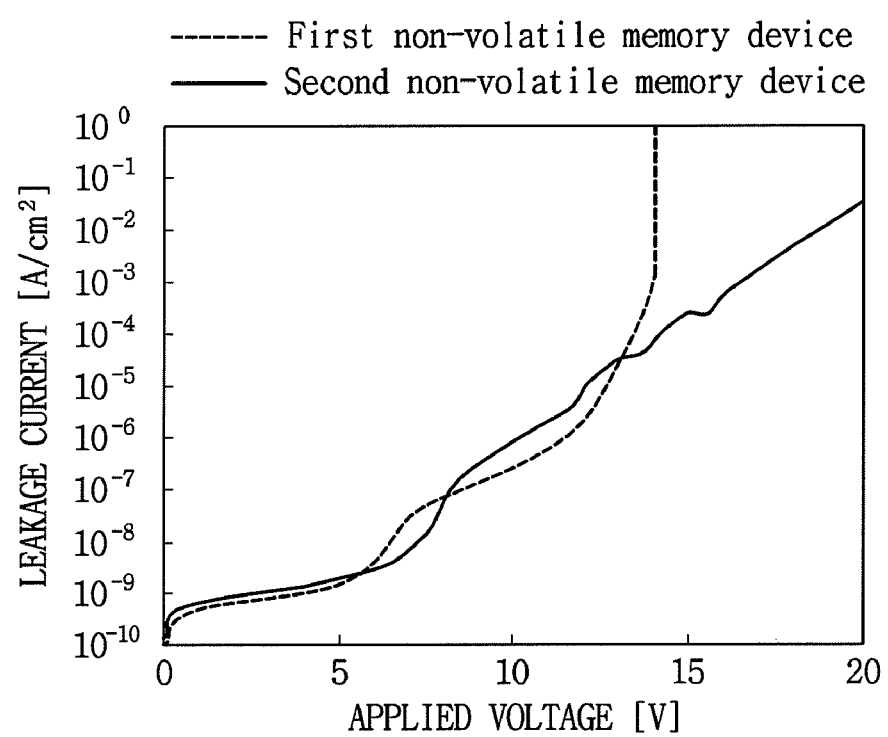
FIG. 10 is a graph illustrating leakage current characteristics of a first non-volatile memory device manufactured by a conventional method and a second non-volatile memory device manufactured according to an exemplary embodiment of the present invention.

FIG. 10 is a graph illustrating the leakage current characteristics of the first and second non-volatile memory devices.

As shown in FIG. 10, the leakage current characteristic of the second non-volatile memory device was improved in comparison with the first non-volatile memory device. For example, the blocking layer of the first non-volatile memory device broke down at a voltage of about 14V.

In accordance with the exemplary embodiments of the present invention as described above, the lower, middle and upper dielectric layers constituting the blocking layer may be sufficiently densified by the heat treatment processes performed at a high temperature. Thus, the leakage current through the blocking layer may be reduced. Consequently, the data reliability of the non-volatile memory device including the blocking layer may be improved.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of manufacturing non-volatile memory device comprising:
   forming a tunnel insulating layer on a substrate;
   forming a conductive pattern on the tunnel insulating layer;
   forming a lower dielectric layer on the conductive pattern;
   performing a first heat treatment process to densify the lower dielectric layer;
   forming a middle dielectric layer on the first heat-treated lower dielectric layer, the middle dielectric layer having an energy band gap smaller than that of the lower dielectric layer;
   forming an upper dielectric layer on the middle dielectric layer, the upper dielectric layer including a material substantially identical to that of the lower dielectric layer;
   performing a second heat treatment process to densify the middle dielectric layer and the upper dielectric layer; and
   forming a conductive layer on the second heat-treated upper dielectric layer.

2. The method of claim 1, wherein the first and second heat treatment processes are performed at a temperature of about 900° C. to about 1250° C.

3. The method of claim 2, wherein the first and second heat treatment processes are performed at a temperature of about 1000° C. to about 1200° C.

4. The method of claim 1, wherein the lower dielectric layer comprises a first metal oxide and the middle dielectric layer comprises a second metal oxide having a dielectric constant higher than that of the first metal oxide.

5. The method of claim 4, wherein the lower dielectric layer comprises aluminum oxide and the middle dielectric layer comprises hafnium oxide or zirconium oxide.

6. The method of claim 4, wherein the first and second heat treatment processes are performed under a gas atmosphere comprising nitrogen.

7. The method of claim 6, wherein a partial pressure of oxygen in the gas atmosphere is no greater than about $1 \times 10^{-4}$ Torr.

8. The method of claim 7, wherein the partial pressure of oxygen in the gas atmosphere is in a range of about $1 \times 10^{-6}$ Torr to about $1 \times 10^{-4}$ Torr.

9. The method of claim 6, wherein a partial pressure of oxygen in the gas atmosphere is no greater than about $1 \times 10^{-6}$ Torr.

10. The method of claim 1, further comprising performing a third heat treatment process to density the middle dielectric layer after forming the middle dielectric layer.

11. The method of claim 1, further comprising patterning the conductive layer, the upper dielectric layer, the middle dielectric layer, the lower dielectric layer, the conductive pattern and the tunnel insulating layer to form a gate structure on the substrate.

12. The method of claim 11, further comprising forming source/drain regions at surface portions of the substrate adjacent to the gate structure.

* * * * *